(12) United States Patent
Kim et al.

(10) Patent No.: US 8,674,362 B2
(45) Date of Patent: Mar. 18, 2014

(54) ORGANIC LIGHT EMITTING DISPLAY DEVICE AND METHOD FOR MANUFACTURING THE SAME

(75) Inventors: Sung-Ho Kim, Yongin (KR); Jong-Hyun Choi, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 153 days.

(21) Appl. No.: 13/200,405

(22) Filed: Sep. 23, 2011

(65) Prior Publication Data

US 2012/0326150 A1    Dec. 27, 2012

(30) Foreign Application Priority Data

Jun. 27, 2011  (KR) .................. 10-2011-0062428

(51) Int. Cl.
    *H01L 29/04*    (2006.01)

(52) U.S. Cl.
    USPC .......... 257/59; 257/72; 257/E27.001; 438/48; 438/149; 438/151

(58) Field of Classification Search
    USPC ......... 257/59, 72, E27.001; 438/48, 149, 151
    See application file for complete search history.

(56) References Cited

U.S. PATENT DOCUMENTS 7,125,758 B2 * 10/2006 Choi et al. .................... 438/151
7,612,375 B2 * 11/2009 Makita ............................ 257/61

FOREIGN PATENT DOCUMENTS

| JP | 2002-184567 A | 6/2002 |
| KR | 10 2004-001118 A | 2/2004 |
| KR | 10 2011-0003201 A | 1/2011 |

* cited by examiner

*Primary Examiner* — Anthony Ho
(74) *Attorney, Agent, or Firm* — Lee & Morse, P.C.

(57) ABSTRACT

An exemplary embodiment may include a substrate, an insulating layer on the substrate, and a pixel electrode including a transparent conductive layer on the insulating layer. A portion of a surface of the insulating layer contacting the transparent conductive layer has a plurality of recessed holes formed by etching with an etchant into an interface between the transparent conductive layer of the pixel electrode and the insulating layer.

20 Claims, 9 Drawing Sheets

ORGANIC LIGHT EMITTING DISPLAY DEVICE AND METHOD FOR MANUFACTURING THE SAME

RELATED APPLICATIONS

This application claims priority to and the benefit of Korean Patent Application No. 10-2011-0062428 filed in the Korean Intellectual Property Office on Jun. 27, 2011, the entire contents of which are incorporated herein by reference.

BACKGROUND

1. Field

Embodiments relate to an organic light emitting diode (OLED) display and a manufacturing method thereof.

2. Description of the Related Art

An organic light emitting diode (OLED) display has garnered much attention as a next-generation display because of its characteristics, i.e., wide viewing angle, fast response rate, less power consumption, lighter weight, and a slim size.

SUMMARY

An exemplary embodiment may be directed to an organic light emitting diode (OLED), and a manufacturing method of the organic light emitting diode (OLED) display.

According to an exemplary embodiment, an organic light emitting diode (OLED) display includes a substrate, an insulating layer on the substrate, and a pixel electrode including a transparent conductive layer on the insulating layer. A portion of a surface of the insulating layer contacting the transparent conductive layer has a plurality of recessed holes formed by etching with an etchant into an interface between the transparent conductive layer of the pixel electrode and the insulating layer.

The plurality of recessed holes may function like lenses.

The transparent conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The etchant may include fluoric acid (HF) and ammonium fluoride ($NH_4F$).

The fluoric acid may be included in the etchant at less than 1.5 wt %, and the ammonium fluoride may be included in the etchant at less than 35 wt %.

The insulating layer may include silicon nitride (SiNx).

The organic light emitting diode (OLED) display may further include: an active layer formed with a semiconductor material between the substrate and the insulating layer; a gate electrode disposed on the same layer as the pixel electrode on the insulating layer and including the transparent conductive layer and a metal layer on the transparent conductive layer; an added insulating layer having an insulating layer opening exposing the pixel electrode, the added insulating layer on the insulating layer to cover the gate electrode; a source electrode and a drain electrode on the added insulating layer and respectively electrically connected to the active layer; an organic emission layer on the pixel electrode; and a common electrode on the organic emission layer.

The pixel electrode may further include a metal layer on a portion of the transparent conductive layer.

The metal layer may include at least one of a metal of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

A first capacitor electrode made of the semiconductor material with a same layer as the active layer and a second capacitor electrode formed with a same layer and a same material as the gate electrode, the second capacitor electrode overlapping the first capacitor electrode may be further included.

According to an exemplary embodiment, a method of manufacturing an organic light emitting diode (OLED) display includes: forming an insulating layer on a substrate; forming a pixel electrode including a transparent conductive layer on the insulating layer; and etching a portion of a surface of the insulating layer contacting the transparent conductive layer of the pixel electrode through an etchant to form a plurality of recessed holes.

The etchant may penetrate into an interface between the transparent conductive layer of the pixel electrode and the insulating layer.

The plurality of recessed holes may function like lenses.

The transparent conductive layer may include at least one of indium tin oxide (ITO), indium zinc oxide (IZO), zinc oxide (ZnO), indium oxide ($In_2O_3$), indium gallium oxide (IGO), and aluminum zinc oxide (AZO).

The etchant may include fluoric acid (HF) and ammonium fluoride (NH4F).

The fluoric acid may be included in the etchant at less than 1.5 wt %, and the ammonium fluoride may be included in the etchant at less than 35 wt %.

The insulating layer may include silicon nitride (SiNx).

The method of manufacturing the organic light emitting diode (OLED) display may further include: forming an active layer made of a semiconductor material on the substrate before forming the insulating layer; depositing the transparent conductive layer and a metal layer on the same layer as the pixel electrode on the insulating layer to form a gate electrode; forming an added insulating layer having an insulating layer opening exposing the pixel electrode, the added insulating layer covering the gate electrode on the insulating layer; forming a source electrode and a drain electrode respectively electrically connected to the active layer on the added insulating layer; forming an organic emission layer on the pixel electrode; and forming a common electrode on the organic emission layer.

The metal layer may include at least one of a metal of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

A first capacitor electrode made of the semiconductor material with a same layer as the active layer and a second capacitor electrode formed with a same layer and a same material as the gate electrode, the second capacitor electrode overlapping the first capacitor electrode may be further included.

BRIEF DESCRIPTION OF THE DRAWINGS

The above and other features will become more apparent to those of ordinary skill in the art by describing in detail exemplary embodiments thereof with reference to the attached drawings in which.

DETAILED DESCRIPTION

Figure 1:
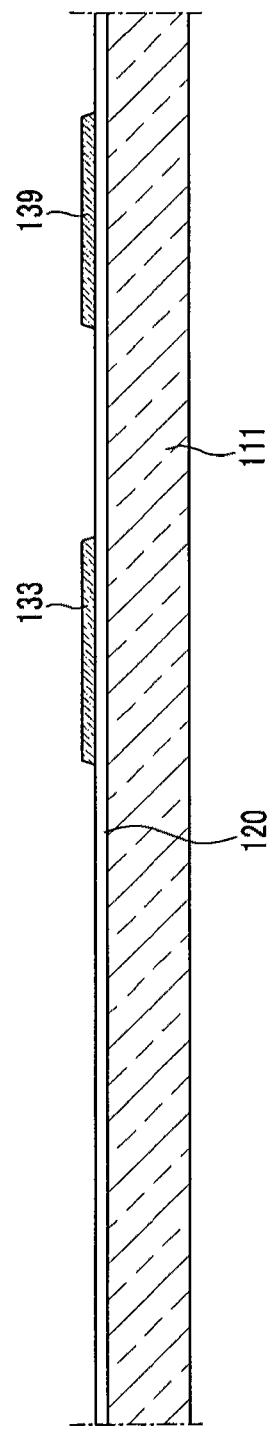
FIG. 1 to FIG. 6 are cross-sectional views sequentially showing a manufacturing process of an organic light emitting diode (OLED) display according to an exemplary embodiment.

Example embodiments will now be described more fully hereinafter with reference to the accompanying drawings; however, they may be embodied in different forms and should not be construed as limited to the embodiments set forth herein.

The drawings are schematic and are not proportionally scaled. Relative scales and ratios in the drawings are enlarged or reduced for the purpose of accuracy and convenience, and the scales are random and are not limited thereto. In addition, like reference numerals designate like structures, elements, or parts throughout the specification. It will be understood that when an element is referred to as being "on" another element, it can be directly on another element or intervening elements may be present therebetween.

Exemplary embodiments described with reference to cross-sectional views represent ideal exemplary embodiments. Therefore, various modification of diagrams, for example, modifications of manufacturing methods and/or specifications, are expected. Accordingly, exemplary embodiments are not limited to specific shapes of shown regions, and for example, also include modifications of the shape by manufacturing.

Referring to FIG. 1 to FIG. 9, an organic light emitting diode (OLED) display 101 and a manufacturing method according to an exemplary embodiment will be described.

A manufacturing method of an organic light emitting diode (OLED) display 101 according to an exemplary embodiment will be described focusing on a thin film transistor 10, an organic light emitting element 70, and a capacitor 90 according to a deposition sequence.

As shown in FIG. 1, a buffer layer 120 is formed on a substrate 111. Also, an active layer 133 and a first capacitor electrode 139 are formed on the buffer layer 120.

The substrate 111 is formed of a transparent and insulating substrate made of glass, quartz, ceramic, or plastic. In addition, when the substrate 111 is made of plastic, the substrate 111 may be a flexible substrate.

The buffer layer 120 is formed with a single layer or a multi-layer including at least one of insulating layers, i.e., a silicon oxide layer or a silicon nitride layer using a chemical vapor deposition method or a physical vapor deposition method.

The buffer layer 120 prevents diffusion or penetration of moisture or impurities generated from the substrate 111, smoothes the surface, and controls the transmission speed of heat during a crystallization process for forming a semiconductor layer.

Also, the buffer layer 120 can be omitted depending on the type of substrate 111 and process conditions.

The active layer 133 and the first capacitor electrode 139 are formed on the buffer layer 120. The active layer 133 and the first capacitor electrode 139 are formed by patterning a thin film made of a semiconductor material, i.e., an amorphous silicon layer, a polysilicon layer, or an oxide semiconductor layer. In other words, the active layer 133 and the first capacitor electrode 139 are patterned through a first photolithography process.

The polysilicon layer can be formed by forming an amorphous silicon layer and crystallizing it. In this instance, the amorphous silicon layer can be crystallized by various methods known to a person skilled in the art, i.e., solid phase crystallization, excimer laser crystallization, metal induced crystallization (MIC), metal induced lateral crystallization (MILC), sequential lateral solidification (SLS), and super grain silicon (SGS) crystallization.

However, the exemplary embodiment is not limited thereto. Therefore, the first capacitor electrode 139 can be formed in a different layer from the active layer 133 or of a different material therefrom without being patterned with the active layer 133.

Figure 2:
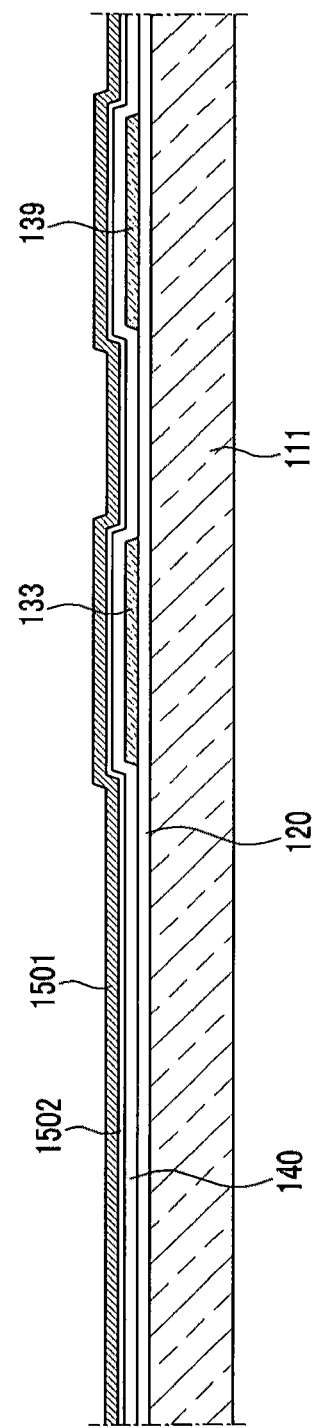

Next, as shown in FIG. 2, an insulating layer 140 is formed on the active layer 133 and the first capacitor electrode 139. In detail, the insulating layer 140 covers the active layer 133 and the first capacitor electrode 139 on the buffer layer 120.

The insulating layer 140 can be formed with a single layer or multiple layers including at least one of various insulating materials known to a skilled person, i.e., tetra ethyl ortho silicate (TEOS), silicon nitride (SiNx), and silicon oxide ($SiO_2$). In an exemplary embodiment, the uppermost layer of the insulating layer may include silicon nitride (SiNx).

The insulating layer 140 insulates the active layer 133 and the gate electrode 153 from each other and has a function as a dielectric layer of the capacitor 90. Also, a transparent conductive layer 1502 and a metal layer 1501 are sequentially deposited on the insulating layer 140.

The transparent conductive layer 1502 may include at least one of indium tin oxide (ITO), indium zinc oxide (IZO), zinc oxide (ZnO), indium oxide ($In_2O_3$), indium gallium oxide (IGO), and aluminum zinc oxide (AZO).

The metal layer 1501 may include at least one of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu). Also, the metal layer 1501 may have a multi-layer structure formed with different metals.

Figure 3:
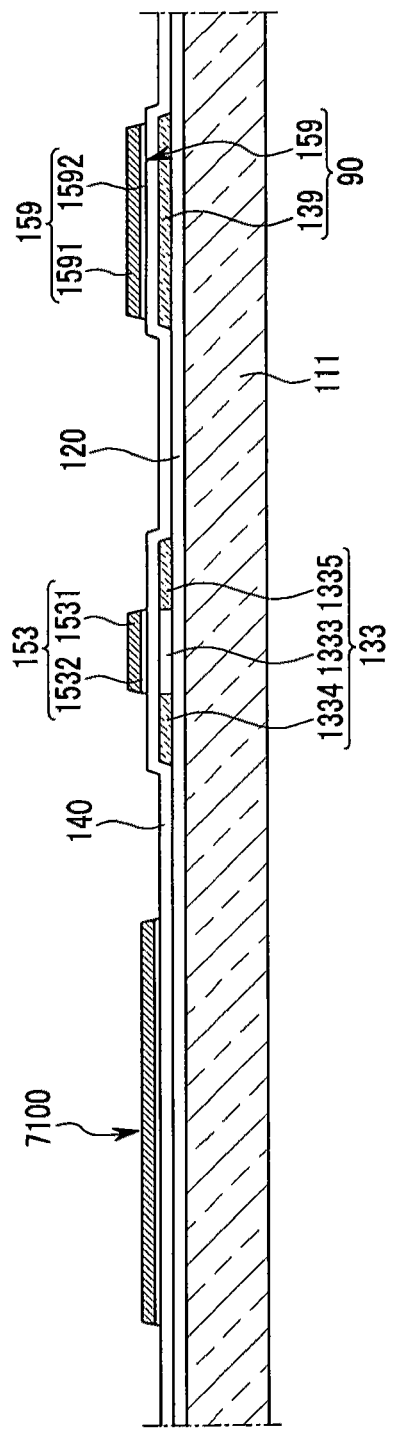

Next, as shown in FIG. 3, the transparent conductive layer 1502 and the metal layer 1501 are patterned through a second photolithography process to form a gate electrode 153, a second capacitor electrode 159, and a pixel electrode intermediate 7100.

The gate electrode 153 includes a gate metal layer 1531 and a gate transparent conductive layer 1532, and the second capacitor electrode 159 includes a capacitor metal layer 1591 and a capacitor transparent conductive layer 1592. However, the exemplary embodiment is not limited thereto. Accordingly, the gate electrode 153 and the second capacitor electrode 159 may be formed with the gate metal layer 1531 and the capacitor metal layer 1591 except for the gate transparent conductive layer 1532 and the capacitor transparent conductive layer 1592. Also, the second capacitor electrode may be formed with the capacitor transparent conductive layer 1592.

The first capacitor electrode 139, the second capacitor electrode 159, and the insulating layer 140 between the first capacitor electrode 139 and the second capacitor electrode 159 form the capacitor 90.

Also, the second capacitor electrode 159 may not be patterned along with the gate electrode 153. Instead, the second capacitor electrode 159 may be formed on a different layer from the gate electrode 153.

An ion impurity is doped in a portion of the active layer 133 by using the gate electrode 153 as a self-align mask. The portion of the active layer 133 doped with the impurity forms a source region 1334 and a drain region 1335. Also, the portion overlapping the gate electrode 153 and not doped with the impurity forms a channel region 1333. The source region 1334 and the drain region 1335 are disposed on respective sides of the channel region 1333. Accordingly, in the exemplary embodiment, no additional mask is added and an ion impurity is doped to a partial region of the active layer 133 to form the source region 1334 and the drain region 1335.

Figure 4:
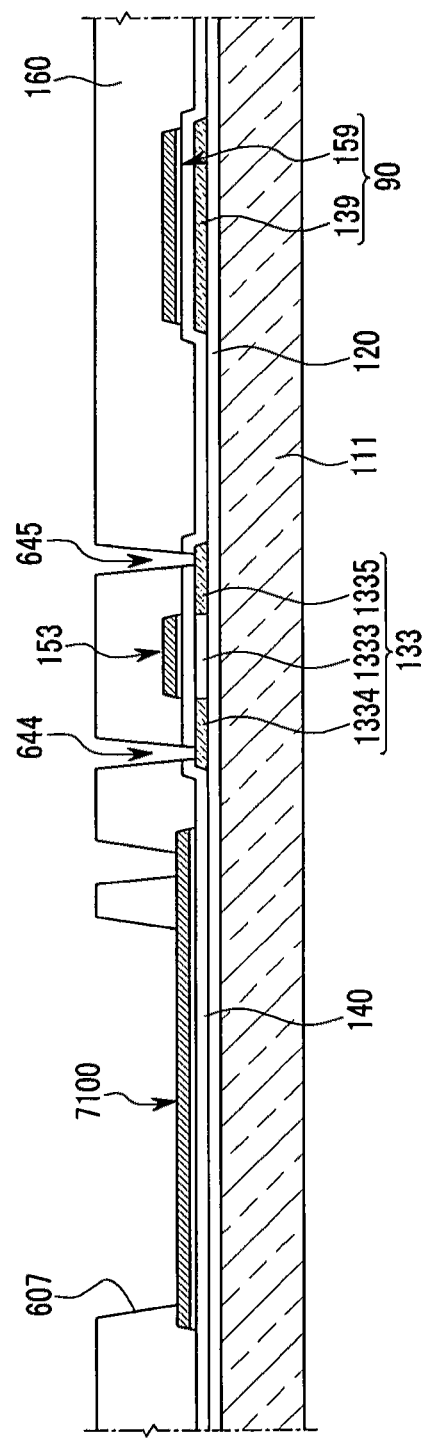

As shown in FIG. 4, an additional insulation layer 160 is formed to cover the gate electrode 153 and the second capacitor electrode 159. The additional insulation layer 160 includes an insulation layer opening 607 that exposes the pixel electrode intermediate 7100. Hereinafter, the insulating layer 140 will be referred to as the first insulating layer and the additional insulating layer 160 will be referred to as the second insulating layer.

Also, the second insulation layer 160 and the first insulation layer 140 have a plurality of contact holes 644 and 645 for respectively exposing parts of the source region 1334 and the drain region 1335 of the active layer 133.

The plurality of contact holes 644 and 645 and the insulation layer opening 607 are formed through a third photolithography process.

Figure 5:
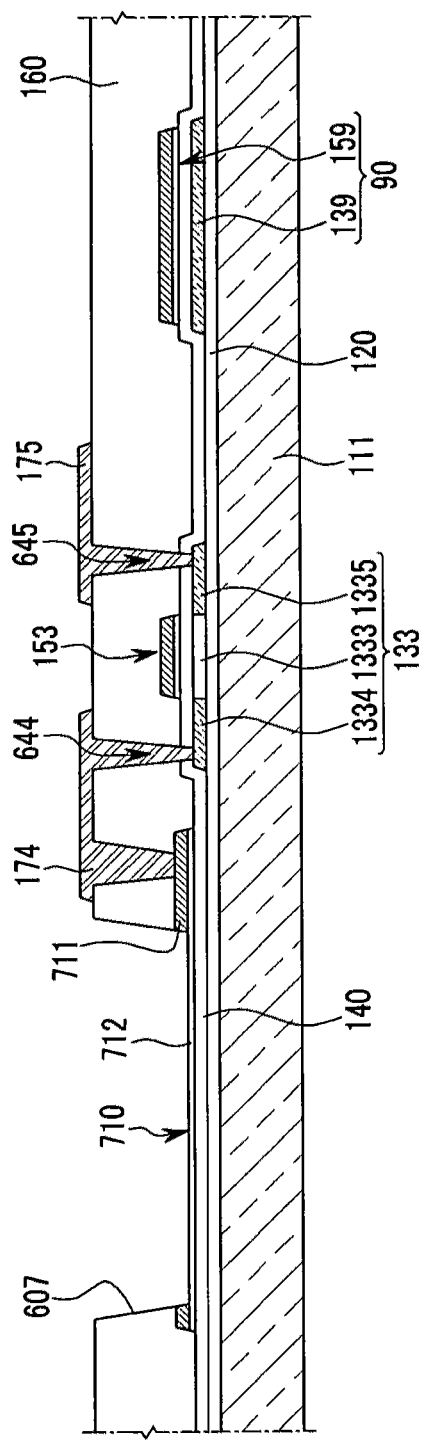

Next, as shown in FIG. 5, the metal layer of the pixel electrode intermediate 7100 exposed through the insulating layer opening 607 is removed to form a pixel electrode 710.

The pixel electrode 710 includes a transparent conductive layer 712 formed directly on the first insulating layer 140 and a metal layer 711 formed on a portion of the transparent conductive layer 712. Here, the metal layer 711 is formed at a portion that is not exposed through the insulating layer opening 607. In other words, the metal layer 711 is formed at the portion that is covered by the second insulating layer 160.

The metal layer of the pixel electrode intermediate 7100 exposed through the insulating layer opening 607 may be removed through the second photolithography process for patterning the gate electrode 153 and the first capacitor electrode 159. In this case, the second photolithography process includes halftone exposure or dual exposure.

Next, a source electrode 174 and a drain electrode 175 are formed on the second insulating layer 160. The source electrode 174 and the drain electrode 175 may be formed through the third photolithography process. The source electrode 174 and the drain electrode 175 are respectively connected to the source region 1334 and the drain region 1335 of the active layer 133 through the plurality of contact holes 644 and 645 of the second insulating layer 160. Accordingly, the thin film transistor (TFT) 10 including the gate electrode 153, the active layer 133, the source electrode 174, and the drain electrode 175 is formed.

The source electrode 174 and the drain electrode 175 can be formed to be a single layer or multiple layers by using various kinds of metals or alloys known to a person skilled in the art.

After the source electrode 174 and the drain electrode 175 are formed, the ion impurity may be doped to the first capacitor electrode 139. The first capacitor electrode 139 made of a semiconductor material as a target is doped with B or P ions with a concentration of at least $1\times10^{15}$ atoms/cm$^2$. Hence, the conductivity of the first capacitor electrode 139 is improved to increase the capacitance of the capacitor 90. The process for doping the first capacitor electrode 139 with the ion impurity can be omitted in some embodiments, and can be performed in other steps.

Figure 6:
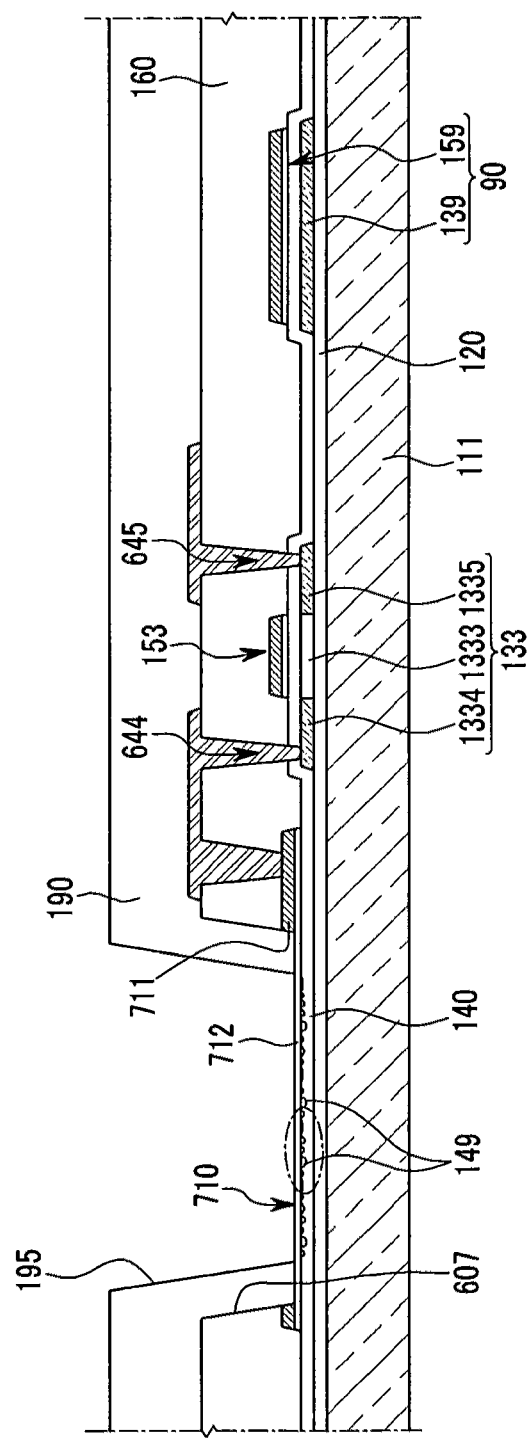

As shown in FIG. 6, a pixel definition layer 190 for covering the source electrode 174 and the drain electrode 175 is formed. The pixel definition layer 190 has a pixel opening 195 exposing at least a part of the pixel electrode 710. Throughout the specification, the term "at least a part" represents a part or the whole. The pixel definition layer 190 can be made of various kinds of organic materials or inorganic materials known to a person skilled in the art.

Next, the portion of one surface of the first insulating layer 140 contacting the transparent conductive layer 712 of the pixel electrode 710 is etched by using an etchant to form a plurality of recessed holes 149. The etchant penetrates into the interface between the transparent conductive layer 712 of the pixel electrode 710 and the first insulating layer 140 such that the portion of the first insulating layer 140 is etched. Here, a plurality of recessed holes 149 function like a lens such that the total reflection of the light is minimized when the light generated in an organic emission layer 720 that will be formed on the pixel electrode 710 is emitted in the direction of the substrate 111.

The etchant may include fluoric acid (HF) and ammonium fluoride (NH$_4$F). Here, fluoric acid at less than 1.5 wt % may be included in the etchant, and ammonium fluoride at less than 35 wt % may be included in the etchant.

Figure 7:
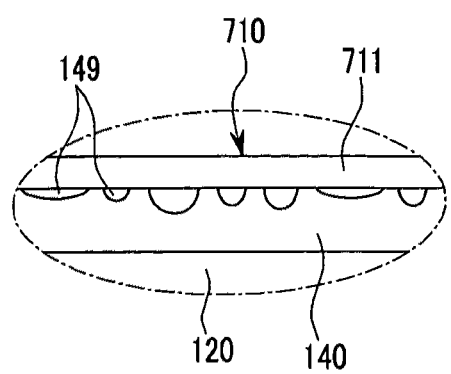
FIG. 7 is an enlarged cross-sectional view of the center of recessed holes formed at an insulating layer of FIG. 6.
Figure 8:
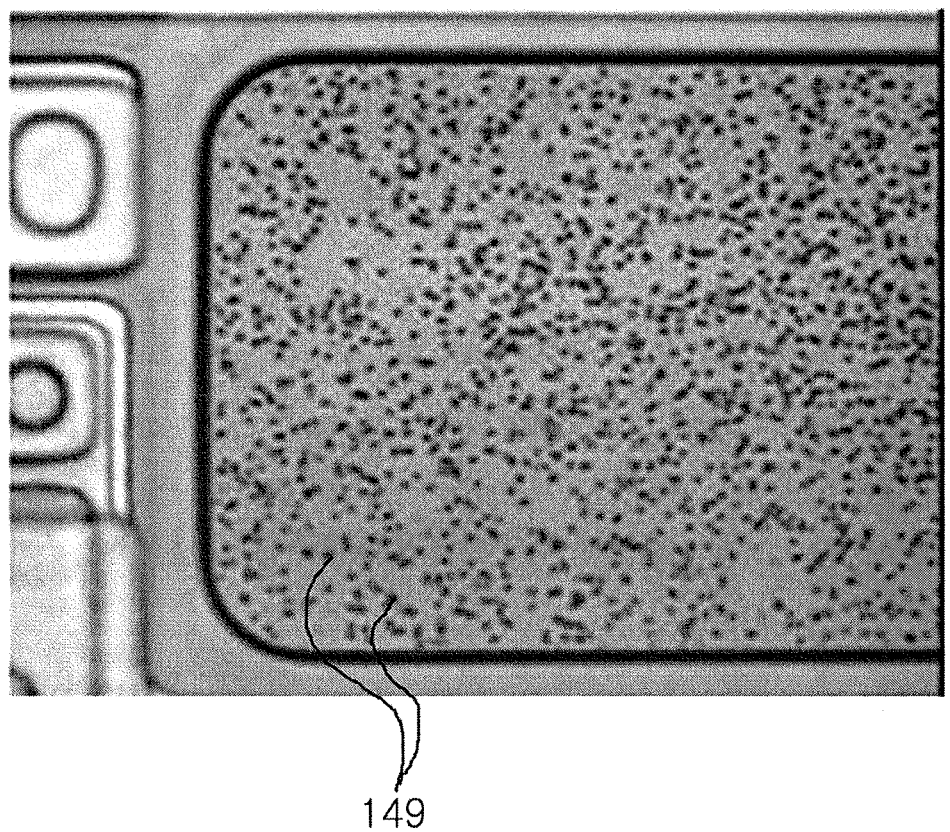
FIG. 8 is an enlarged top plan view of the center of recessed holes formed at an insulating layer of FIG. 6.

FIG. 7 and FIG. 8 show a plurality of recessed holes 149 formed in the first insulating layer 140. As shown in FIG. 7, the plurality of recessed holes 149 are formed at the surface contacting the transparent conductive layer 712 of the pixel electrode 710. The plurality of recessed holes 149 are positioned at a position overlapping the organic emission layer 720, as shown in FIG. 8.

Figure 9:
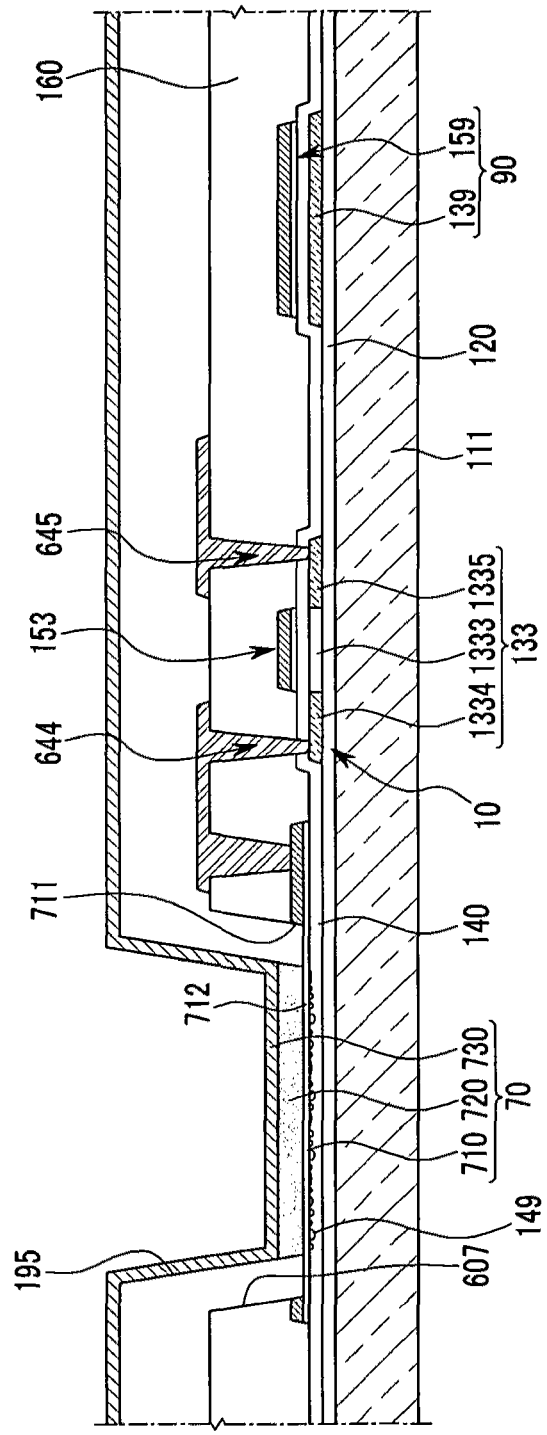
FIG. 9 is a cross-sectional view of an organic light emitting diode (OLED) display according to an exemplary embodiment.

As shown in FIG. 9, the organic emission layer 720 is formed on the pixel electrode 710 in the pixel opening 195. A low molecular weight organic material or a high molecular weight organic material is used for the organic emission layer 720.

The organic emission layer 720 has a hole transport layer (HTL) and a hole injection layer (HIL) stacked in the direction of the pixel electrode 710 with respect to the emission layer, and has an electron transport layer (ETL) and an electron injection layer (EIL) stacked in the direction of the common electrode 730. In addition, various other layers can be stacked.

A common electrode 730 is formed on the organic emission layer 720. The organic light emitting diode (OLED) display 101 according to an exemplary embodiment uses the pixel electrode 710 for the anode and the common electrode 730 for the cathode. However, the exemplary embodiment is not limited thereto, and the pixel electrode 710 and the common electrode 730 may function in reverse polarity.

Also, the common electrode 730 may be made of a material including a reflective material. The common electrode 730 can be made of Al, Ag, Mg, Li, Ca, LiF/Ca, or LiF/Al.

Therefore, the organic light emitting element 70 including the pixel electrode 710, the organic emission layer 720, and the common electrode 730 is completed.

Although not shown, a sealing member for protecting the organic emission layer 720 from moisture or oxygen from the outside may be disposed on the common electrode 730.

The organic light emitting diode (OLED) display 101 according to an exemplary embodiment manufactured by the above-described manufacturing method, as shown in FIG. 9, includes the plurality of recessed holes 149 having the function of the lens and formed on the portion of the first insulating layer 140 contacting the transparent conductive layer 712 of the pixel electrode 710 while being a bottom light emitting type realizing an image in the direction of the substrate 111. Thus, the light extraction efficiency may be effectively improved.

The plurality of recessed holes 149 function like concave lenses such that the total reflection when the light generated from the organic emission layer 720 formed on the pixel electrode 710 is emitted in the direction of the substrate 111 may be minimized.

By way of summation and review, an organic emission layer generating light in an organic light emitting diode (OLED) display is enclosed by a plurality of transparent layers or transflective layers. The transparent layers or the transflective layers have different refractive indexes such that a portion of light generated from the organic emission layer is totally reflected in the organic light emitting diode (OLED) display and lost. In other words, not all light generated in the organic light emitting element is used. Thus, light extraction efficiency of the organic light emitting diode (OLED) display is deteriorated.

Embodiments relate to an organic light emitting diode (OLED) display with improved light extraction efficiency and a manufacturing method which at the same may be easily, simply, and effectively manufactured with a large area process. Also, the manufacturing method of the organic light emitting diode (OLED) display, according to an exemplary embodiment, minimizes a number of photolithography processes such that it is easy to apply to a large area.

Exemplary embodiments have been disclosed herein, and although specific terms are employed, they are used and are to be interpreted in a generic and descriptive sense only and not for purpose of limitation.

What is claimed is:

1. An organic light emitting diode (OLED) display, comprising:
    a substrate;
    an insulating layer on the substrate;
    a pixel electrode including a transparent conductive layer on the insulating layer,
    wherein a portion of a surface of the insulating layer contacting the transparent conductive layer has a plurality of recessed holes at an interface between the transparent conductive layer of the pixel electrode and the insulating layer; and
    an organic emission layer on the pixel electrode and overlapping the plurality of recessed holes.

2. The organic light emitting diode (OLED) display as claimed in claim 1, wherein the plurality of recessed holes act like lenses.

3. The organic light emitting diode (OLED) display as claimed in claim 1, wherein the transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

4. The organic light emitting diode (OLED) display as claimed in claim 1, wherein the insulating layer includes silicon nitride (SiNx).

5. The organic light emitting diode (OLED) display as claimed in claim 1, further comprising:
    an active layer formed with a semiconductor material between the substrate and the insulating layer;
    a gate electrode disposed on the same layer as the pixel electrode on the insulating layer and including the transparent conductive layer and a metal layer on the transparent conductive layer;
    an added insulating layer having an insulating layer opening exposing the pixel electrode and formed on the insulating layer to cover the gate electrode;
    a source electrode and a drain electrode on the added insulating layer and respectively electrically connected to the active layer; and
    a common electrode on the organic emission layer.

6. The organic light emitting diode (OLED) display as claimed in claim 5, wherein the pixel electrode further includes a metal layer, the metal layer being on a portion of the transparent conductive layer.

7. The organic light emitting diode (OLED) display of claim 5, wherein
    the metal layer includes at least one of a metal of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

8. The organic light emitting diode (OLED) display of claim 5, further comprising
    a first capacitor electrode made of the semiconductor material with a same layer as the active layer and a second capacitor electrode formed with a same layer and a same material as the gate electrode, the second capacitor electrode overlapping the first capacitor electrode.

9. A method of manufacturing an organic light emitting diode (OLED) display, comprising:
    forming an insulating layer on a substrate;
    forming a pixel electrode including a transparent conductive layer on the insulating layer;
    forming a plurality of recessed holes in a surface of the insulating layer; and
    forming an organic emission layer on the transparent conductive layer and overlapping the plurality of recessed holes.

10. The method as claimed in claim 9, wherein forming the plurality of recessed holes includes etching a portion of the surface of the insulating layer using an etchant, wherein the etchant penetrates into an interface between the transparent conductive layer of the pixel electrode and the insulating layer.

11. The method as claimed in claim 9, wherein
    the plurality of recessed holes act like lenses.

12. The method as claimed in claim 9, wherein
    the transparent conductive layer includes at least one of indium tin oxide (ITO), indium zinc oxide (IZO), zinc oxide (ZnO), indium oxide ($In_2O_3$), indium gallium oxide (IGO), and aluminum zinc oxide (AZO).

13. The method of claim 9, wherein forming the plurality of recessed holes includes etching a portion of the surface of the insulating layer suing an etchant, wherein the etchant includes fluoric acid (HF) and ammonium fluoride ($NH_4F$).

14. The method as claimed in claim 13, wherein
    the fluoric acid is included in the etchant at less than 1.5 wt %, and the ammonium fluoride is included in the etchant at less than 35 wt %.

15. The method as claimed in claim 9, wherein
    the insulating layer includes silicon nitride (SiNx).

16. The method as claimed in claim 9, further comprising:
    forming an active layer made of a semiconductor material on the substrate before forming the insulating layer;
    depositing the transparent conductive layer and a metal layer on the same layer as the pixel electrode on the insulating layer to form a gate electrode;
    forming an added insulating layer having an insulating layer opening exposing the pixel electrode, the added insulating layer covering the gate electrode on the insulating layer;

forming a source electrode and a drain electrode respectively electrically connected to the active layer on the added insulating layer; and forming a common electrode on the organic emission layer.

17. The method as claimed in claim 16, wherein the metal layer includes at least one of a metal of aluminum (Al), platinum (Pt), palladium (Pd), silver (Ag), magnesium (Mg), gold (Au), nickel (Ni), neodymium (Nd), iridium (Ir), chromium (Cr), nickel (Li), calcium (Ca), molybdenum (Mo), titanium (Ti), tungsten (W), and copper (Cu).

18. The method as claimed in claim 16, further comprising a first capacitor electrode made of the semiconductor material with a same layer as the active layer and a second capacitor electrode formed with a same layer and a same material as the gate electrode, the second capacitor electrode overlapping the first capacitor electrode.

19. A method of manufacturing a device, comprising:

foaming an insulating layer on a substrate;

forming a pixel electrode including a transparent conductive layer on the insulating layer; and etching a portion of a surface of the insulating layer contacting the transparent conductive layer of the pixel electrode using fluoric acid (HF) and ammonium fluoride ($NH_4F$) to form a plurality of recessed holes.

20. The method as claimed in claim 19, wherein the fluoric acid is included in the etchant at less than 1.5 wt %, and the ammonium fluoride is included in the etchant at less than 35 wt %.

* * * * *